United States Patent
Von Ammon

[11] Patent Number: 6,059,874
[45] Date of Patent: May 9, 2000

[54] PROCESS AND DEVICE FOR REDUCING THE LOAD ON A SEED CRYSTAL

[75] Inventor: Wilfried Von Ammon, Hochburg/Ach, Austria

[73] Assignee: Wacker Siltronic Gesellschaft für Halbleitermaterialien AG, Burghausen, Germany

[21] Appl. No.: 09/135,867

[22] Filed: Aug. 18, 1998

[30] Foreign Application Priority Data

Aug. 28, 1997 [DE] Germany .......................... 197 37 605

[51] Int. Cl.⁷ .................................................. C03B 15/32
[52] U.S. Cl. .............................. 117/13; 117/217; 117/218
[58] Field of Search .............................. 117/13, 217, 218

[56] References Cited

U.S. PATENT DOCUMENTS 4,973,518  11/1990  Kida et al. .............................. 428/364

FOREIGN PATENT DOCUMENTS 0286133  10/1988  European Pat. Off. .
9202691   8/1997  Japan .
9301794  11/1997  Japan .

OTHER PUBLICATIONS

English Derwent Abstract corresponding to JP 9–301794.
Patent Abstracts of Japan, vol. 18, No. 46 (C–1157), Jan. 25, 1994 & JP 05–270968 A (Mitsubishi Materials Corp.).
English Derwent Abstract corresponding to JP 9–202691.

Primary Examiner—Felisa Hiteshew
Attorney, Agent, or Firm—Collard & Roe, P.C.

[57] ABSTRACT

A process for reducing the load on a seed crystal during the pulling of a single crystal uses a pulling device. An adhesive bond is made between a conical section at the start of the single crystal and a retaining body. The load on the seed crystal is reduced by creating a tensile stress between the retaining body and the pulling device.

8 Claims, 1 Drawing Sheet

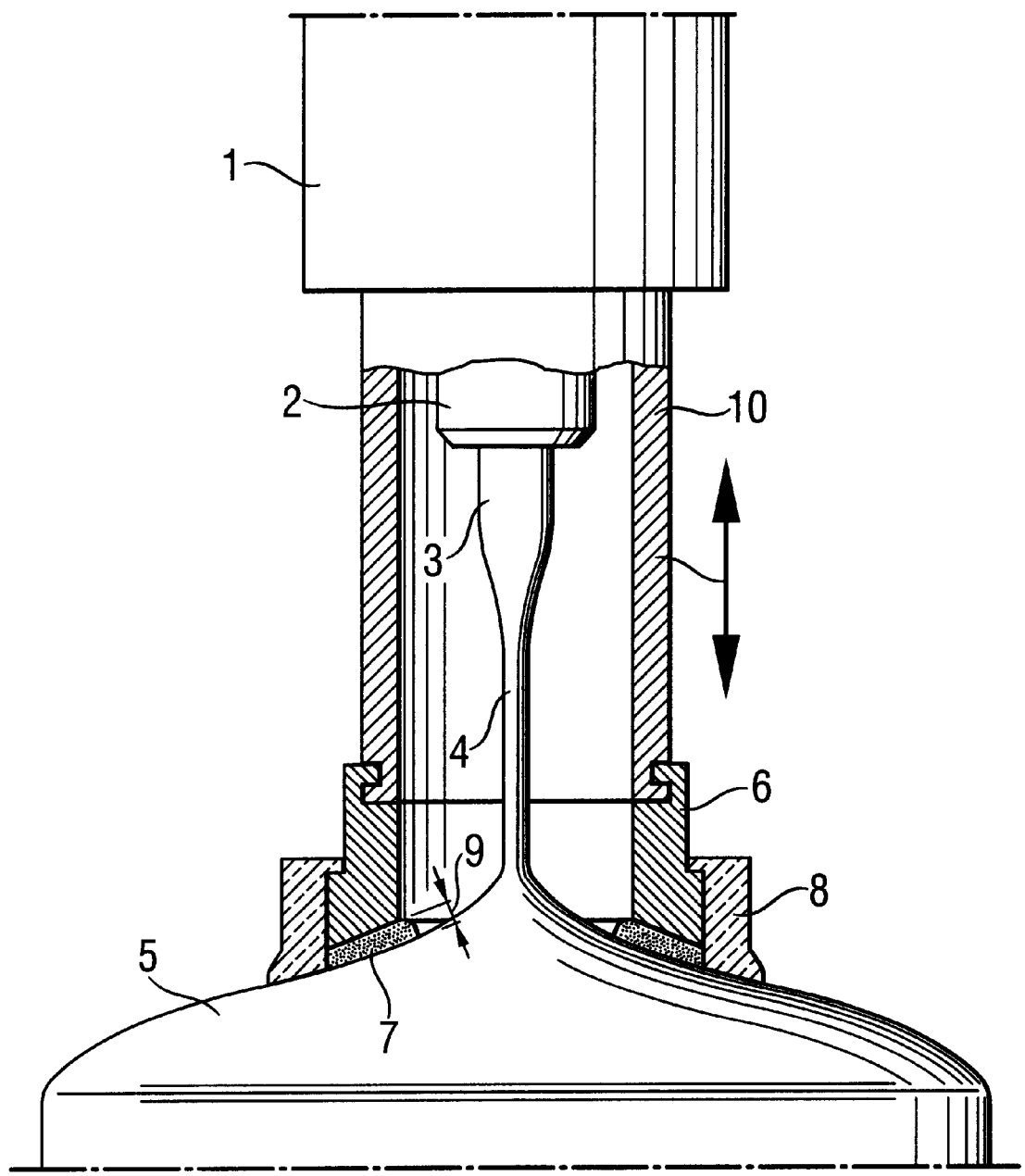

PROCESS AND DEVICE FOR REDUCING THE LOAD ON A SEED CRYSTAL

BACKGROUND OF THE INVENTION

1. Field of the Invention

The invention relates to a process and a device for reducing the load on a seed crystal during the pulling of a single crystal according to the Czochralski method. The process is used for the production of single crystals from silicon or compound semiconductors for electronics. During the process, a seed crystal which is dipped into a melt is pulled away from the melt with the aid of a pulling device, while a single crystal grows on its underside. During pulling, care is taken that a so-called neck with comparatively small diameter is first produced so that the single crystal can be pulled without dislocations. The single crystal comprises a beginning conical section with increasing diameter, a cylindrical middle section with almost constant diameter, and a conical terminal section with decreasing diameter. Only the cylindrical middle section is of interest as a basic product for the electronics industry.

2. The Prior Art

U.S. Pat. No. 4,973,518 discloses that the neck can become axially loaded with a comparatively heavy weight when the single crystal is being pulled. The application of any transverse force should also be avoided since there is a risk of the neck breaking even under slight loading. To avoid this risk, the conical section is pulled so that it is given a wider diameter at an axial position. This forms a bulge where the single crystal can be supported with a gripping device.

This process has disadvantages for the production of single crystals which have diameters of $\geq 200$ mm in the cylindrical section. For example, the material needed to produce the bulge cannot be used for electronic purposes. This requires a complicated procedure to produce the special shape to be pulled. Also, the bulge may not successfully be given an exact rotationally symmetric shape. Hence, the possibility of the neck being loaded by transverse forces cannot absolutely be eliminated when the gripping device is engaged. Even if this does not cause the neck to break, there is a risk that the axis of rotation of the single crystal will be shifted. Hence, the cylindrical section will no longer grow in a straight line.

SUMMARY OF THE INVENTION

It is an object of the present invention to solve the problems discussed above and to achieve the result that comparatively heavy single crystals can be pulled by the Czochralski method.

The invention relates to a process for reducing the load on a seed crystal during the pulling of a single crystal by means of a pulling device, wherein an adhesive bond is formed between a beginning conical section of the single crystal and a retaining body, and the load on the seed crystal is reduced by creating a tensile stress between the retaining body and the pulling device.

The invention also makes it possible to pull heavy single crystals whose weight is in excess of the loading limit of the neck for axial loads. When using the invention, the single crystal is loaded only parallel to its longitudinal axis. Thus, problems produced by transverse loading are prevented.

The invention also relates to a device for reducing the load on a seed crystal during the pulling of a single crystal from a melt by means of a pulling device, which comprises a retaining body and an adhesive bond between the retaining body and a beginning conical section of the single crystal, and means for creating a tensile stress between the retaining body and the pulling device.

BRIEF DESCRIPTION OF THE DRAWING

Other objects and features of the present invention will become apparent from the following detailed description considered in connection with the accompanying drawing which discloses one embodiment of the present invention. It should be understood, however, that the drawing is designed for the purpose of illustration only and not as a definition of the limits of the invention.

The FIGURE shows a sectional side view of a preferred embodiment of the device of the invention.

DETAILED DESCRIPTION OF PREFERRED EMBODIMENT

Turning now in detail to the drawing, the pulling device used is a pulling shaft 1 which has a holder 2 in which a seed crystal 3 is clamped. As shown in the drawing, neck 4 and conical section 5 at the start of the single crystal have already been pulled. There is an adhesive bond 7 between the surface of conical section 5 and retaining body 6.

According to the preferred embodiment which is shown, retaining body 6 has a hollow cylindrical shape and is enclosed by a sealing ring 8 which bears on the surface of conical section 5. The sealing ring seals a gap 9 which is filled with the adhesive bond. Between retaining body 6 and pulling shaft 1, there is a connection which can be shortened and is provided by an axially movable rod system 10. The rod system is anchored at one end in the pulling shaft and connected at the other end to retaining body 6.

When the single crystal is pulled, the beginning conical section 5 at the start of the single crystal is first allowed to be pulled until its surface area is large enough for an adhesive bond to be made between the conical section and retaining body 6. The conical section needs to be cooled to a specific temperature $T_1$ which is tailored to the properties of the material from which the adhesive bond is to be made. Substances such as glass, glass reinforced with glass fibers, germanium and silver which set as a function of temperature are particularly suitable. This material is brought into contact with the surface of the conical section. Temperature $T_1$ must be high enough for the material to become liquid or at least soften as a result of the contact.

Sealing ring 8 prevents liquid material from passing over the shoulder of the conical section into the melt. Sealing ring 8 is lowered together with retaining body 6 to the surface of the conical section until it touches, whereby it may soften in the contact region. The sealing ring is preferably made of glass or glass reinforced with glass fibers. After sealing ring 8 has been put on, there is a gap 9 between the surface of the conical section and retaining body 6. This gap is filled with adhesive bond 7. The material used for the adhesive bond, for example germanium granules, is applied to the surface of the conical section where it liquefies and penetrates the gap which is sealed off from the outside.

The use of a sealing ring may be omitted even though the adhesive may become soft on contact with the single crystal. This omission is possible if the adhesive bond material still remains too viscous to leave the contact region. In this case, the retaining body which is lowered to the surface of the conical section is made of a material that is suitable for the adhesive bond. This suitable material is located at least wherever contact is made with the surface of the conical section.

As the pulling of the single crystal continues, the conical section cools further, and the material for the adhesive bond sets. When the conical section has cooled to a lower temperature $T_2<T_1$, the load on the seed crystal can be reduced. To do this, rod system 10 is raised and a tensile stress is created which counteracts the force due to the weight of the single crystal. The magnitude of this tensile stress is preferably increased during the pulling of the single crystal as a function of the increasing single crystal mass.

While only one embodiment of the present invention has been shown and described, it is to be understood that many changes and modifications may be made thereunto without departing from the spirit and scope of the invention as defined in the appended claims.

What is claimed is:

1. A process for reducing a load on a seed crystal during the pulling of a single crystal from a melt using a pulling device, comprising the steps of:

providing a pulling device having a pulling shaft having a holder in which a seed crystal is clamped, said pulling shaft having a retaining body;

lowering said seed crystal into said melt and then pulling a single crystal by means of said pulling device;

creating an adhesive bond between a conical section at the beginning of the single crystal and said retaining body; and reducing the load on the seed crystal by creating a tensile stress between the retaining body and the pulling device; said tensile stress counteracting the weight of the single crystal.

2. The process as claimed in claim 1, comprising cooling the temperature of the conical section of the single crystal to a temperature $T_1$ to create said adhesive bond; and cooling the temperature of the conical section to a lower temperature $T_2$ to create said tensile stress.

3. The process as claimed in claim 1, comprising increasing the tensile stress as a function of the single crystal mass that grows as the single crystal is pulled.

4. A pulling device for reducing a load on a seed crystal during the pulling of a single crystal from a melt comprising:

a pulling shaft having a holder in which a seed crystal is clamped, said pulling shaft having a retaining body;

means for forming an adhesive bond between the retaining body and a beginning conical section at the start of the single crystal; and means for creating a tensile stress between said retaining body and the pulling shaft; said tensile stress counteracting the weight of the single crystal.

5. The device as claimed in claim 4, wherein the means for forming the adhesive bond is a material selected from a group consisting of glass, glass reinforced with glass fibers, germanium and silver.

6. The device as claimed in claim 4, wherein the retaining body has a hollow cylindrical shape.

7. The device as claimed in claim 4, further comprising a sealing ring which is placed on the beginning conical section and seals a gap between the beginning conical section and the retaining body; and said gap accommodating the adhesive bond.

8. The device as claimed in claim 4, wherein the single crystal has a longitudinal axis; and wherein means for creating a tensile stress comprises a rod system which can be moved parallel to said longitudinal axis of the single crystal and connects the retaining body and the pulling shaft.

* * * * *